United States Patent
Takabayashi et al.

(10) Patent No.: US 6,703,555 B2
(45) Date of Patent: Mar. 9, 2004

(54) SOLAR CELL STRING, SOLAR CELL ARRAY AND SOLAR PHOTOVOLTAIC POWER SYSTEM

(75) Inventors: Akiharu Takabayashi, Nara (JP); Hidetoshi Tsuzuki, Kanagawa (JP); Hidehisa Makita, Kyoto (JP); Masaaki Matsushita, Nara (JP); Takaaki Mukai, Nara (JP); Shigenori Itoyama, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/157,490

(22) Filed: May 30, 2002

(65) Prior Publication Data

US 2002/0195136 A1 Dec. 26, 2002

(30) Foreign Application Priority Data

May 31, 2001 (JP) ........................ 2001-164356

(51) Int. Cl.$^7$ .................. H01L 31/048; H01L 31/05
(52) U.S. Cl. ............... 136/244; 136/251; 136/291; 136/293; 60/641.8; 52/173.3
(58) Field of Search ............... 136/244, 251, 136/291, 293; 60/641.8; 52/173.3

(56) References Cited

U.S. PATENT DOCUMENTS

| | | | | |
|---|---|---|---|---|
| 3,151,379 A | * | 10/1964 | Escoffery | 136/244 |
| 3,330,700 A | * | 7/1967 | Golub et al. | 136/244 |
| 5,998,729 A | | 12/1999 | Shiomi et al. | 136/251 |
| 6,093,884 A | | 7/2000 | Toyomura et al. | 136/244 |
| 6,265,242 B1 | | 7/2001 | Komori et al. | 438/66 |
| 6,291,761 B1 | | 9/2001 | Takada et al. | 136/244 |
| 6,307,144 B1 | | 10/2001 | Mimura et al. | 136/244 |
| 6,331,671 B1 | | 12/2001 | Makita et al. | 136/244 |
| 2001/0034982 A1 | * | 11/2001 | Nagao et al. | 52/173.3 |
| 2001/0050102 A1 | * | 12/2001 | Matsumi et al. | 136/244 |
| 2003/0010373 A1 | * | 1/2003 | Tsuzuki et al. | 136/244 |
| 2003/0075211 A1 | * | 4/2003 | Makita et al. | 136/244 |

FOREIGN PATENT DOCUMENTS

| | | | |
|---|---|---|---|
| JP | 2000-27394 A | * | 1/2000 |
| JP | 2000-207662 | | 7/2000 |

OTHER PUBLICATIONS

IEEE Guide to Terrestrial Photovoltaic Power System Safety (IEEE standard 1374–1998), 1998.*

* cited by examiner

Primary Examiner—Alan Diamond
(74) Attorney, Agent, or Firm—Fitzpatrick, Cella, Harper & Scinto

(57) ABSTRACT

The solar cell string of the present invention comprises a plurality of solar cells interconnected in series and/or parallel, one positive terminal, and one negative terminal, wherein at least a part of an electric line thereof is not housed in an insulating envelope, and the line is grounded at an electrical middle point between the positive and negative terminals or a point on the side of the negative terminal with respect to the electrical middle point, whereby an environmental resistant coating significantly responsible for a cost of a solar cell module and an insulating coating of a member for interconnecting solar cells in series and/or parallel can be simplified, and safety of an exposed electric line resulting from the simplification of the environmental resistant coating and the insulating coating can be improved.

15 Claims, 13 Drawing Sheets

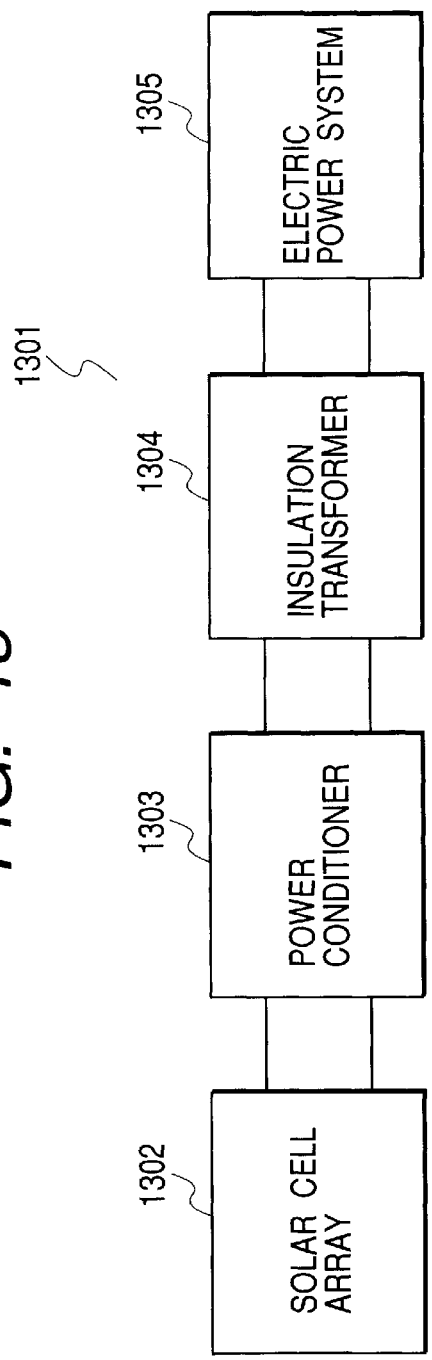
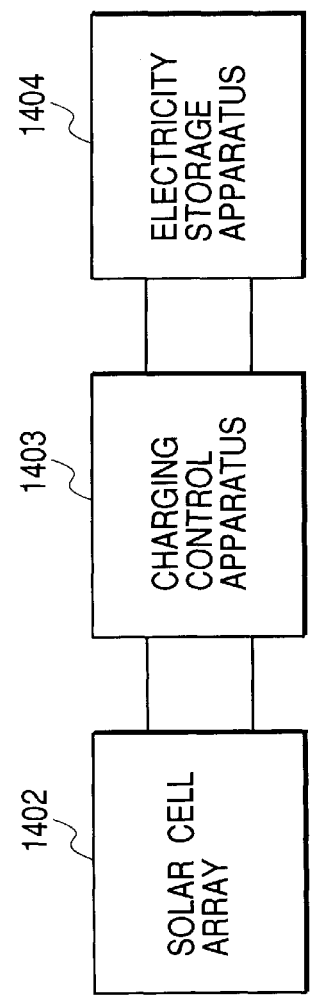

SOLAR CELL STRING, SOLAR CELL ARRAY AND SOLAR PHOTOVOLTAIC POWER SYSTEM

BACKGROUND OF THE INVENTION

1. Field of the Invention

The present invention relates to a solar cell string having at least a part of an electric line thereof not housed in an insulating envelope, a solar cell array having the solar cell string, and a solar photovoltaic power system having the solar cell array.

2. Related Background Art

In recent years, awareness of ecological problems has been raised worldwide. Among others, the global warming resulting from $CO_2$ emission is seriously concerned about, and clean energy has been desired increasingly. In such a circumstance, a solar cell shows great promise to serve as a source of clean energy in terms of its safety and operability. The solar cell includes a photoelectric conversion layer for converting light into electricity, typical materials of which include single-crystalline silicon semiconductor, polycrystalline silicon semiconductor, amorphous silicon-based semiconductor, III-V compound semiconductor, II-VI compound semiconductor and I-III-VI2 compound semiconductor.

A solar photovoltaic power system including such a solar cell exists in a wide variety of scales from several watts to several thousands kilowatts. For example, a battery may be used to store energy generated by the solar cell, or a DC-AC converter may be used to supply output energy of the solar cell to a commercial system. FIG. 1 is a block diagram of a typical solar photovoltaic power system disclosed in Japanese Patent Application Laid-Open No. 2000-207662. In this solar photovoltaic power system, four solar cell strings 104 to 107 are connected in parallel to constitute a solar cell array 101, each of the solar cell strings being composed of a plurality of solar cell modules connected in series. An output of the solar cell array 101 is led to a power conditioner 102 having a controller for performing control of a maximum output and the like, and then supplied to a load 103. The load 103 may be an electric power system, and such a system of flowing the power of the solar cell back to the electric power system is referred to as a utility connected system.

The solar photovoltaic power system is grounded through apparatus grounding or electric line grounding. The former apparatus grounding is generally carried out, and includes the grounding of a frame of the solar cell module and the grounding of a housing of the power conditioner. The latter electric line grounding varies from country to country. In Japan, the electric line of the solar cell array is typically insulated from the ground. On the contrary, in the United States, as described in the IEEE standard 1374-1998: "Guide for Terrestrial Photovoltaic Power System Safety" or the National Electrical Code Article (NEC) 690: "Solar Photovoltaic Systems", the electric line of the solar cell array is generally grounded. In the above-described IEEE standard and NEC, it is described that the grounding of the electric line includes middle point grounding for connecting an electrical middle point of the electric line between the strings, positive-terminal grounding for connecting a positive-side electric line to the ground and negative-terminal grounding for connecting a negative-side electric line to the ground.

FIG. 2 shows an example of the solar photovoltaic power system having the negative-side electric line grounded. In FIG. 2, four solar cell strings 204 to 207 are connected in parallel to constitute a solar cell array 201, each of the solar cell strings being composed of a plurality of solar cell modules connected in series. An output of the solar cell array 201 is led to a power conditioner 202 having a controller for performing control of a maximum output and the like, and then supplied to a load 203. Similarly to the case of FIG. 1, the load 203 may be an electric power system. In addition, the electric line on the side of the negative terminal is connected to the ground via a grounding point 208. Here, in the present application, this example is not identified as a prior art.

FIGS. 3A and 3B show an example of a typical solar cell module used in the solar photovoltaic power system. In this drawing, FIG. 3A is a perspective view of a solar cell module 301 and FIG. 3B is a cross-sectional view taken along the line 3B—3B of FIG. 3A. As shown in FIG. 3B, the solar cell module 301 generally comprises a photovoltaic element 302 for converting received light into electricity, a front cover 303 made of glass, a translucent resin or the like disposed on the side of a light-receiving surface of the photovoltaic element, a back cover 304 made of glass, a resin, a metal or the like disposed on the side of a non-light-receiving surface of the photovoltaic element, an output cable 305, a frame member 307 for reinforcing and fixing the solar cell module, and an adhesive 306 for bonding of the frame member.

One of the largest problems of the solar photovoltaic power system intended for electricity market is reduction of the power generation cost. In order to introduce the solar photovoltaic power system into the electricity market on a full scale, the cost reduction is essential, and it is needed to attain a cost comparing with the cost of conventional thermal power generation or nuclear power generation. However, as reported in an interim report (Jun., 11, 1998) from the Supply and Demand Party of the Advisory Committee for Resources and Energy of the Ministry of Economy, Trade and Industry, the energy cost of the solar photovoltaic power generation is 2.5 to 6 times than the electricity rate in Japan, and a radical cost reduction is needed for full-scale introduction thereof.

SUMMARY OF THE INVENTION

In view of such circumstances, particularly with a view to simplify an environmental resistant coating which significantly increases a cost of a solar cell module and an insulating coating of a member for interconnecting solar cells in series and parallel, an object of this invention is to significantly reduce power generation cost and to provide a solar cell string, a solar cell array and a solar photovoltaic power generation system with improved safety of an exposed electric line resulting from the simplification of the environmental resistant coating and the insulating coating.

In order to attain the object described above, the inventors have earnestly studied and obtained the following findings.

As shown in FIGS. 3A and 3B, besides a photovoltaic element which is an essential component for power generation, a conventional solar cell module requires many members including a front cover, a back cover, a frame member and the like. These members are necessary to protect the solar cell module against thermal stress, optical stress and mechanical stress in an outdoor environment and ensure electrical insulation thereof. The inventors has investigated a novel requirement of the solar cell module, which is intended to protect the photovoltaic element against the environmental stresses but not to ensure the electrical insulation so that a charging part thereof is partly exposed. As a result, a first finding has been obtained that the front cover and the back cover can be significantly reduced in thickness, and therefore, a significant cost reduction can be expected. Furthermore, by also excluding from the requirements the insulation performance for the interconnection member for interconnecting the solar cells in series and parallel, a significant cost reduction can be expected.

By excluding the electrical insulation as described above from the requirement, as expected as a matter of course, safety should be ensured because an insulation resistance between the solar cell array circuit and the ground is small, and the electric line for charging the solar cell array is exposed. Therefore, it is a major premise that such a system having such an exposed charging part is installed in a controlled area to which those other than an administrator are forbidden to enter. Furthermore, the inventors have investigated auxiliary means as an additional measure for safety and noted the IEC standard 60479-1: "Effects of Current on Human Beings." According to this, for a direct current, a human body is affected substantially the same in the cases where the current flows from the ground to an upper part of the human body and where substantially double the current thereof flows from the upper part of the human body to the ground. That is, if a resistance of the human body is uniform, the case where a human body on the ground touches a negative potential with a hand is substantially equivalent where the human body touches a positive potential twice as high as the negative potential. The inventors have conceived that this finding is applied to the auxiliary measure for safety of the solar cell array. That is, the inventors have obtained the second finding that in order to improve safety of the exposed electric line as much as possible, grounding is provided at an arbitrary point between an electrical middle point and a negative terminal, and a maximum potential of the electric line with respect to the ground (if the potential is negative, an absolute value thereof) is determined to satisfy the condition that an absolute value of the maximum positive potential is equal to or more than an absolute value of the maximum negative potential, whereby safety can be improved. Specifically, the highest safety can be attained when the grounding is provided at a position where the ratio of the positive terminal to the negative terminal in absolute value of potential with respect to the ground is substantially 2 to 1.

With reference to FIG. 4, the above finding will be described in more detail. A position where the electric line of the solar cell string is grounded can be any position between the negative and positive terminals of the string. The potential of the electric line with respect to the ground is the same as the ground at the grounding point, and the closer to the positive or negative terminal, the higher in positive or negative direction the potential of the electric line becomes, respectively. Therefore, regardless of the grounding point, it can be said that the maximum absolute value of the voltage to ground is attained at one of the negative and positive terminals of the string. Thus, only for the case where a part of a human body comes into contact with the negative and positive terminals, a current flowing between the human body and the ground is to be investigated. If the resistance of the human body is uniform, the current flowing therethrough is in proportion to the amplitude of the potential at a part to be touched. Thus, when the human body touches the positive terminal, the current is zero if the positive terminal is grounded, and is at the maximum if the negative terminal is grounded, as indicated by a solid line in FIG. 4. As described above, in terms of influence on a human body, the current that flows when the human body touches the negative potential is equivalent to substantially double the current that flows when the human body touches the positive potential. Therefore, comparison of the current flowing in case of touching the positive terminal with the current flowing in case of touching the negative terminal in terms of the influence on the human body can be made by doubling the value of the latter current. A broken line in FIG. 4 is a plot of the doubled value of the current flowing when the human body touches the negative terminal. The equivalent current that flows in this case is zero when the negative terminal is grounded, and is at the maximum when the positive terminal is grounded, the maximum value being twice as large as the current flowing in case of touching the positive terminal when the negative terminal is grounded. As can be seen from FIG. 4, at any grounding point, concerning a larger one of the equivalent currents that flow through the human body in case of touching the positive terminal or the negative terminal, the equivalent current is smaller when the grounding is provided between the negative terminal and the middle point than when the grounding is provided between the middle point and the positive terminal. It is also shown that the larger one of the equivalent currents that flow through the human body when the positive terminal or the negative terminal is touched is at the minimum when the grounding is provided at a position where the ratio of the absolute value of the voltage to ground of the positive terminal to that of the negative terminal is substantially 2 to 1 ("grounding at a point of ratio 2 to 1", in FIG. 4).

As a result of further investigation, the inventors have obtained the third finding that in the case of a plurality of strings, by not grounding all the electric lines of the strings but only one of them, an undesirable loop current or a current flowing over the different strings can be reduced. Now, with reference to FIGS. 5 and 6, this finding will be described in more detail.

FIG. 5 is a schematic circuit diagram of a solar cell array 501. In FIG. 5, a solar cell string is composed of six solar cells 502 interconnected in series and a reverse-current blocking diode 503 connected thereto in series. Five solar cell strings having the same arrangement are interconnected in parallel to form a solar cell array 501 having a positive terminal 504 and a negative terminal 505. Each of the five solar cell strings has one point connected to the ground at a common grounding point 506. With such grounding, a loop current denoted by reference numeral 507 or a current flowing through the different strings, denoted by reference numeral 508, may appear due to variations of characteristics of the solar cells and a condition of a solar radiation. This may cause a reverse bias or current equal to or larger than the rated current in the solar cell. Such an unexpected current can be avoided by grounding only one of the solar cell strings as shown in FIG. 6.

As a result of further investigation, the inventors have obtained the fourth finding that in the case of the utility connected system, an insulation transformer is provided between a power conditioner and a power system to completely separate the solar cell array circuit from the power system circuit in terms of direct current, whereby the power system can be prevented from being affected by a ground-fault current of the solar cell array.

From the above-described findings, the inventors have come to conceive a principal concept of this invention.

A solar cell string of this invention comprises a plurality of solar cells interconnected in series and/or parallel, one positive terminal, and one negative terminal, in which at least a part of an electric line of the solar cell string is not housed in an insulating envelope, and the electric line of the solar cell string is grounded at an electrical middle point between the positive and negative terminals or a point closer to the negative terminal than the electrical middle point.

The solar cell string of this invention, in which the insulating coating of the solar cell or the serial/parallel interconnection member for serial/parallel interconnection is reduced, and a part of the electric line is not housed in the insulating envelope, makes it possible to significantly reduce the cost of material and processing. Besides the major premise that such a solar cell string having an exposed charging part is installed in a controlled area to which those other than an administrator are forbidden to enter, as an auxiliary measure for safety, the electric line of the solar cell string is grounded at the electrical middle point between the positive and negative terminals or a point on the side of the negative terminal with respect to the electrical middle point. In this way, safety can be improved.

In the above-described solar cell string, the electric line of the solar cell string is preferably grounded at a point on the side of the negative terminal with respect to the electrical middle point and on the side of the electrical middle point with respect to the negative terminal, whereby safety can be improved further. More preferably, the electric line of the solar cell string is grounded at a point where a ratio of the positive terminal and the negative terminal in absolute value of voltage to ground is substantially 2 to 1. This can improve safety further. Here, the ratio is described as "substantially 2 to 1", because when the point of the ratio 2 to 1 lies in an internal circuit of the solar cell, the grounding is provided at a point between the solar cells having a potential closest to that of the point of the ratio 2 to 1.

In addition, at least a part of an electrode or wiring member arranged on a light-receiving surface side of the solar cell is not desirably housed in the envelope for insulating the electric line. This can lead to a significant cost reduction. For further cost reduction, it is desired that the solar cell has a photoelectric conversion layer, a collector electrode and a front wiring member arranged on a light-receiving surface side of the photoelectric conversion layer, and a coating member arranged on the light-receiving surface side of the photoelectric conversion layer, and a part of the collector electrode or front wiring member is a non-coated part where the coating member is absent. The coating member can be formed of a resin material by coating to reduce the cost further.

In addition, at least a part of an electrode or wiring member arranged on a non-light-receiving surface side of the solar cell is not desirably housed in the envelope for insulating the electric line. This can lead to a significant cost reduction. For further cost reduction, it is desired that the solar cell has a photoelectric conversion layer, and a back electrode and a back wiring member arranged on a non-light-receiving surface side of the photoelectric conversion layer, a back support member for supporting the solar cell is arranged on the non-light-receiving surface side of the solar cell, at least a part of a surface of the back support member is made of a non-insulating material, and the surface of the non-insulating material is not insulated from the back electrode or back wiring member.

A serial/parallel interconnection member for interconnecting the solar cells in series and/or parallel can be formed of a conductor having no insulating coating, thereby realizing further cost reduction.

A first solar cell array of this invention comprises a plurality of solar cell strings interconnected in parallel, each of the solar cell strings comprising a plurality of solar cells interconnected in series and/or parallel, and is characterized in that the array further has at least one solar cell string according to this invention. Such a configuration can provide an inexpensive and highly safe solar sell array having the above-described advantages of the solar cell string of this invention.

A second solar cell array of this invention comprises a plurality of solar cell strings interconnected in parallel, each of the solar cell strings comprising a plurality of solar cells interconnected in series and/or parallel, and is characterized in that the array further has only one solar cell string according to this invention. Such a configuration can provide an inexpensive and highly safe solar sell array having the above-described advantages of the solar cell string of this invention can be provided, and the undesirable loop current and the current flowing through the different strings.

A first solar photovoltaic power generation system of this invention is characterized in that the system comprises the first or second solar cell array of this invention, a power conditioner for converting a direct current output of the solar cell array into an alternating current output, and an insulation transformer connected to an output of the power conditioner. Such a configuration can provide an inexpensive and highly safe solar photovoltaic power generation system having the above-described advantages of the solar cell array of this invention. Furthermore, the electric power system can be prevented from being affected by the ground-fault current of the solar cell array.

A second solar photovoltaic power generation system of this invention is characterized in that the system comprises the first or second solar cell array of this invention, an electricity storage apparatus for storing electric energy generated by the solar cell array, and a charging control apparatus connected between the solar cell array and the electricity storage apparatus. Such a configuration can provide an inexpensive and highly safe solar photovoltaic power generation system having the above-described advantages of the solar cell array of this invention.

BRIEF DESCRIPTION OF THE DRAWINGS

FIG. 13 is a block diagram for showing an embodiment of a solar photovoltaic power generation system according to this invention; and FIG. 14 is a block diagram for showing an embodiment of a solar photovoltaic power generation system according to this invention.

DESCRIPTION OF THE PREFERRED EMBODIMENTS

Now, embodiments of a solar cell string, a solar cell array and a solar photovoltaic power generation system according to this invention will be described with reference to the drawings as required. Of course, this invention should not be limited to the following description and drawings, and various modification or combination thereof may be appropriately devised without departing from the spirit and scope of this invention.

Figure 7A:
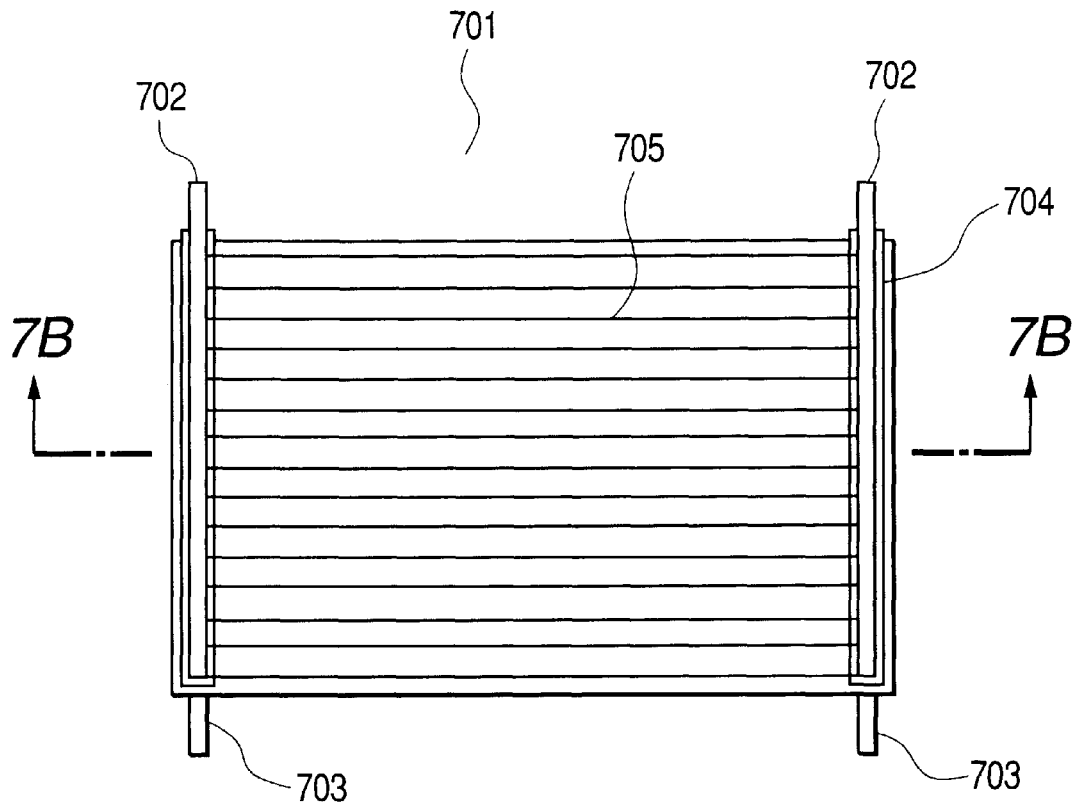
FIGS. 7A and 7B are plan and sectional views for showing an example of a solar cell used in this invention.
Figure 7B:
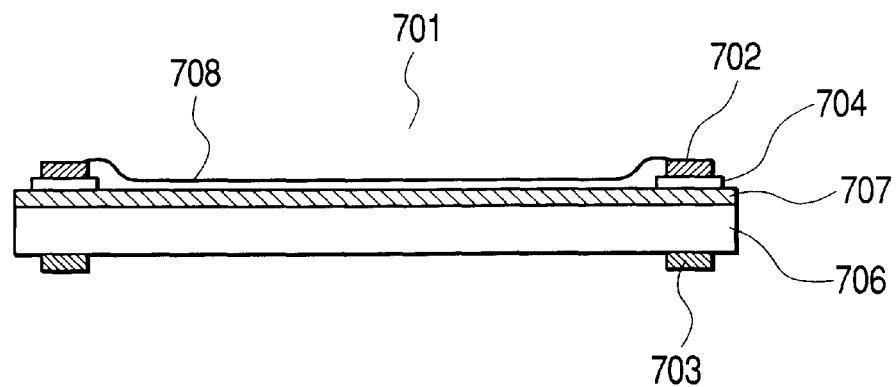

FIGS. 7A and 7B show an example of a solar cell suitable for forming a solar cell string of this invention. In FIGS. 7A and 7B, a solar cell 701 has a photovoltaic element layer 707 formed on a metal substrate 706 also constituting a back electrode, and a collector electrode 705 for collecting a current generated by the photovoltaic element is disposed on the side of a light-receiving surface. For the metal substrate 706, a stainless steel of 0.15 mm thick is used. As the photovoltaic element layer 707, an amorphous silicon-based photovoltaic element is used, and the collector electrode is a copper wire of 100 μm in diameter fixed onto the photovoltaic element layer 707 using a conductive paste. Furthermore, the collector electrode is connected to a front wiring member 702 having a thickness of 100 μm, which is made of copper, and used to interconnect the electrode on the side of the light-receiving surface of the solar cell and an adjacent solar cell in series or parallel. To ensure the insulation between the front wiring member 702 and the metal substrate 706, an insulating member 704 made of polyester is provided therebetween. The metal substrate 706 is spot-welded to the back wiring member 703 having a thickness of 100 μm, which is made of copper and disposed on the side of the non-light-receiving surface thereof, and used to interconnect the electrode on the side of the non-light-receiving surface of the solar cell and an adjacent solar cell in series or parallel. Besides, in order to protect the solar cell against the outdoor environment, the light-receiving surface side of the photovoltaic element layer 707 is covered with a coating member 708 having a thickness of 50 μm, which is made of acrylic resin. However, in order to minimize the cost, the front wiring member 702, the metal substrate 706 and the back wiring member 703 are not covered with the coating member.

Figure 8A:
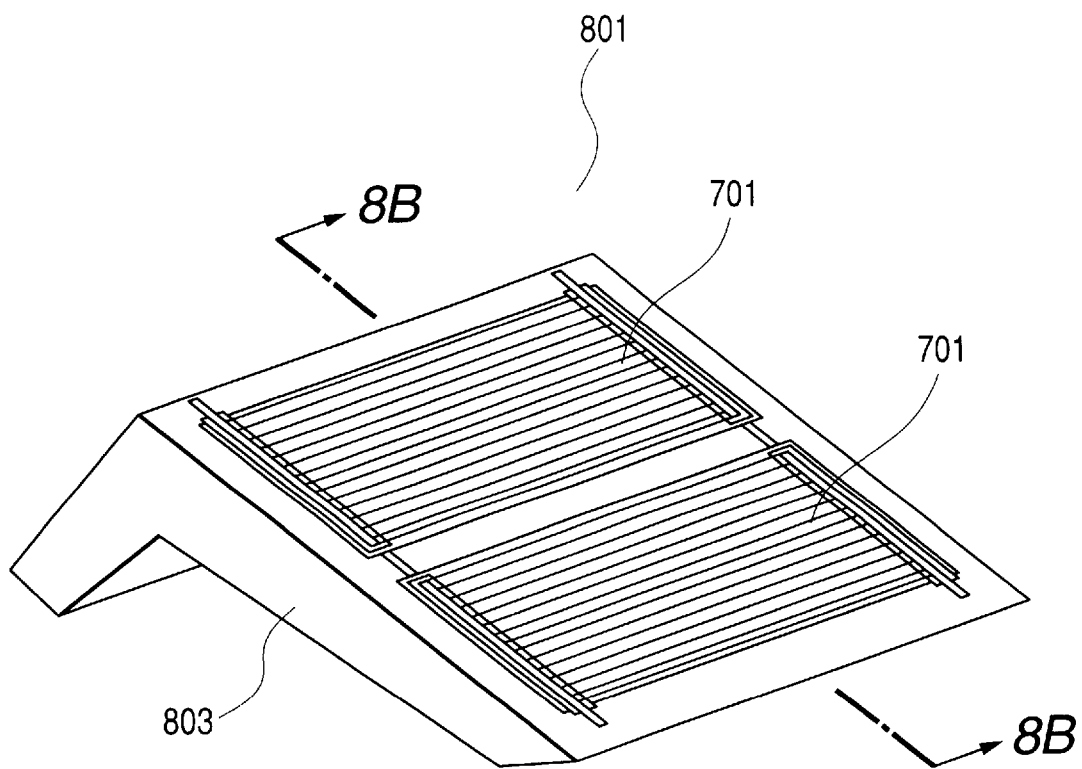
FIGS. 8A and 8B are perspective and sectional view for showing an example of a rest-integrated solar cell used in this invention.
Figure 8B:
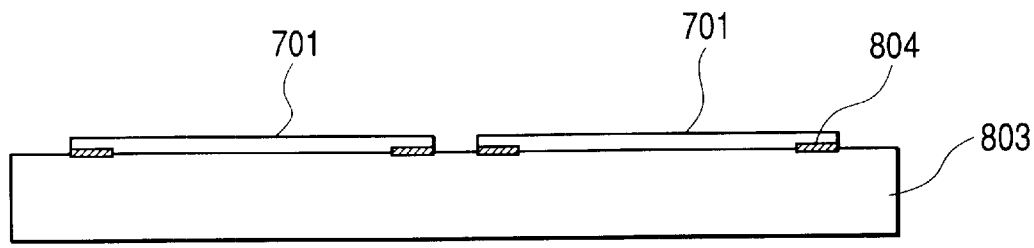

FIGS. 8A and 8B show a preferred example in which the solar cell 701 shown in FIG. 7 is fixed to a back support member. FIGS. 8A and 8B show a rest-integrated solar cell 801 which is formed by applying an elastic epoxy adhesive 804 onto the perimeters of the serialized two solar cells 701 and putting the solar cells on a L-shaped concrete member 803 serving as the back support member. The solar cells 701 are serialized in such a manner that the front wiring member of one of the solar cells 701 is connected to the back wiring member of the other solar cell. As shown in the cross-sectional view taken along the line 8B—8B, the adhesive 804 used to fix the solar cells 701 to the L-shaped concrete member 803 is applied only to the perimeters thereof. Therefore, a portion of the back electrode and the back wiring member at the center of the solar cell 701 are in contact with the surface of the L-shaped concrete member 803, so that electrical insulation between the solar cell circuit and the L-shaped concrete member 803 is not ensured.

Figure 9:
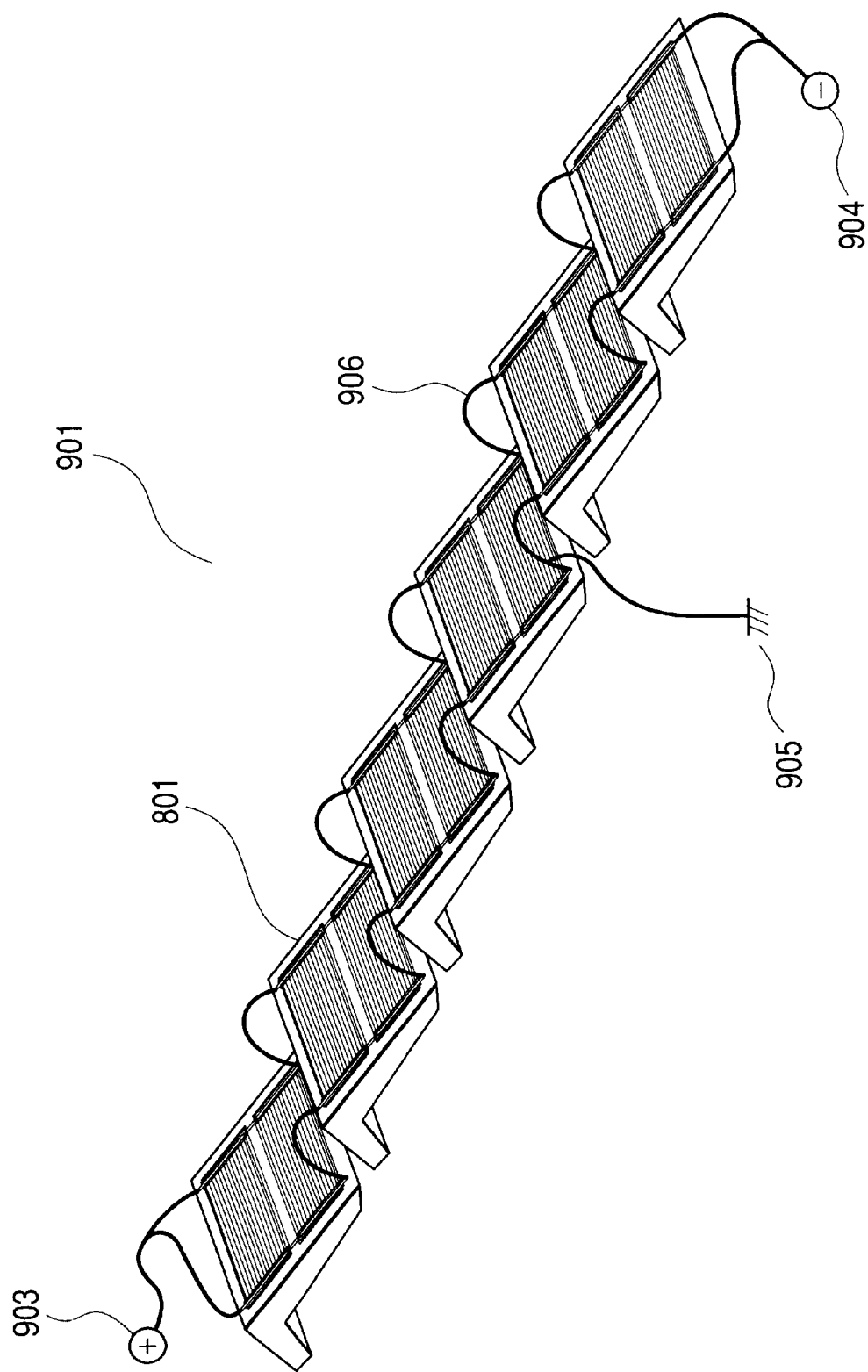
FIG. 9 is a perspective view for showing an embodiment of a solar cell string according to this invention.

FIG. 9 shows an example of a solar cell string formed by connecting in series the rest-integrated solar cells 801 shown in FIGS. 8A and 8B. A solar cell string 901 shown in FIG. 9 is formed by connecting six rest-integrated solar cells 801 using a serializing member 906 and has a positive terminal 903 and a negative terminal 904, the serializing member being made of copper and having no insulating coating. The serializing member is connected to a grounding point 905 at a point between the second and third rest-integrated solar cells from the negative terminal so that the ratio of voltage to ground of the positive terminal 903 to that of the negative terminal 904 is 2 to 1.

Figure 10:
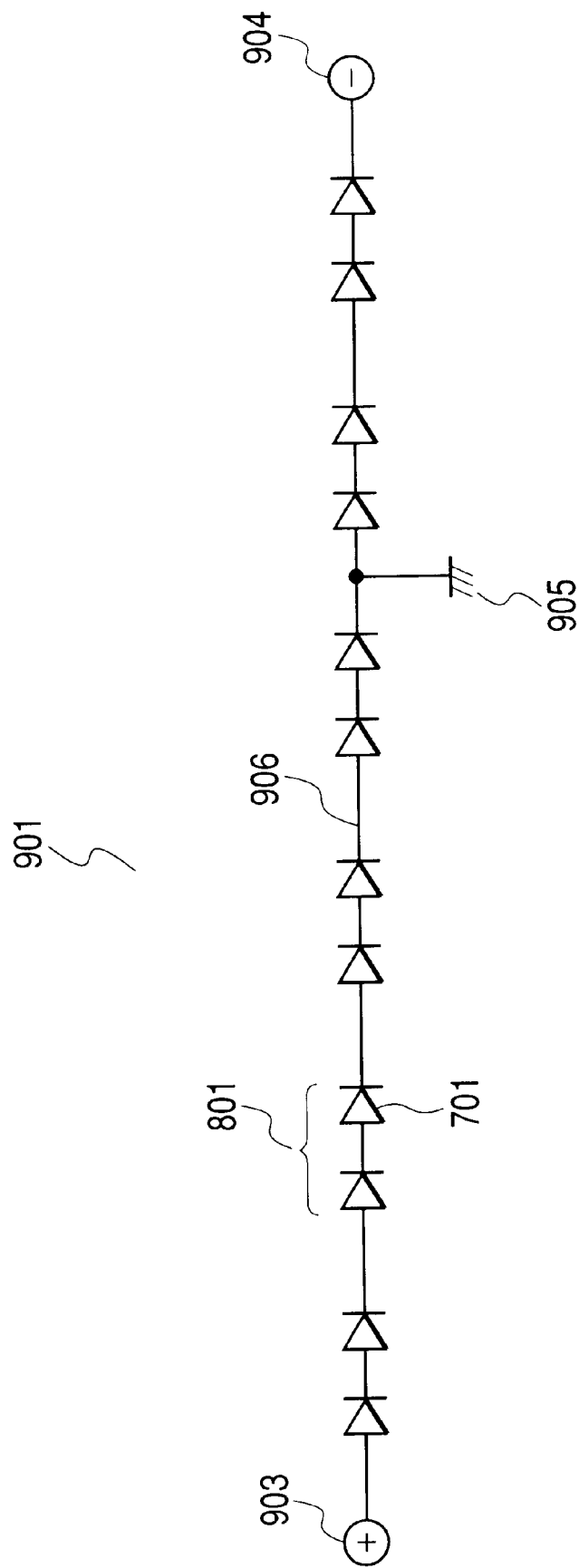
FIG. 10 is an equivalent circuit diagram for showing an embodiment of a solar cell string according to this invention.

FIG. 10 is an equivalent circuit diagram of the solar cell string 901 shown in FIG. 9. The solar cell string 901 is composed of the six rest-integrated solar cells 801 serialized using the serializing member 906 and has the positive terminal 903 and the negative terminal 904, each of the rest-integrated solar cells 801 being composed of the serialized two solar cells 701. The solar sell string is connected to a grounding point 905 at a point between the fourth and fifth solar cells from the negative terminal so that the ratio of voltage to ground of the positive terminal to that of the negative terminal is 2 to 1.

Figure 11:
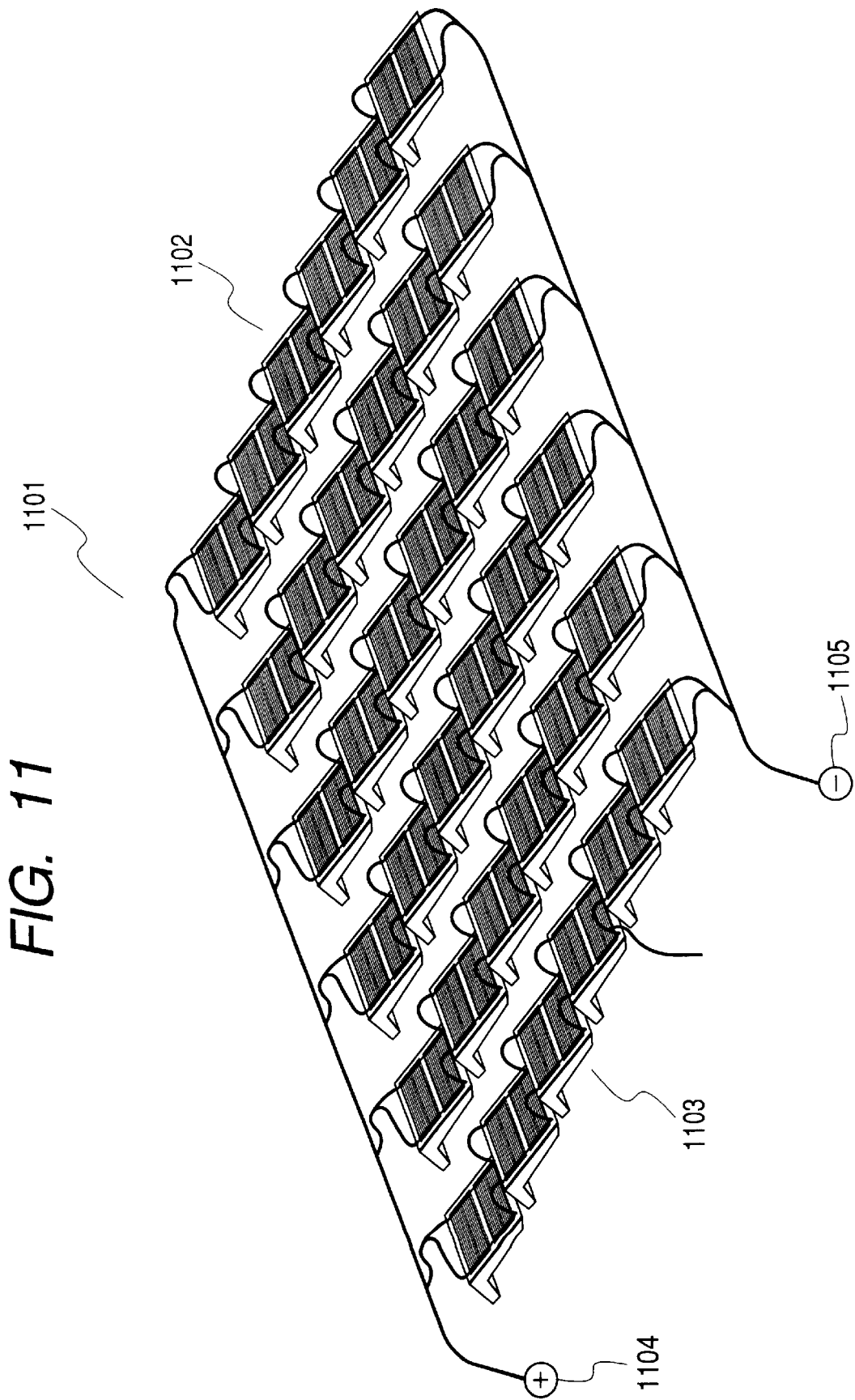
FIG. 11 is a perspective view for showing an embodiment of a solar cell array according to this invention.
Figure 12:
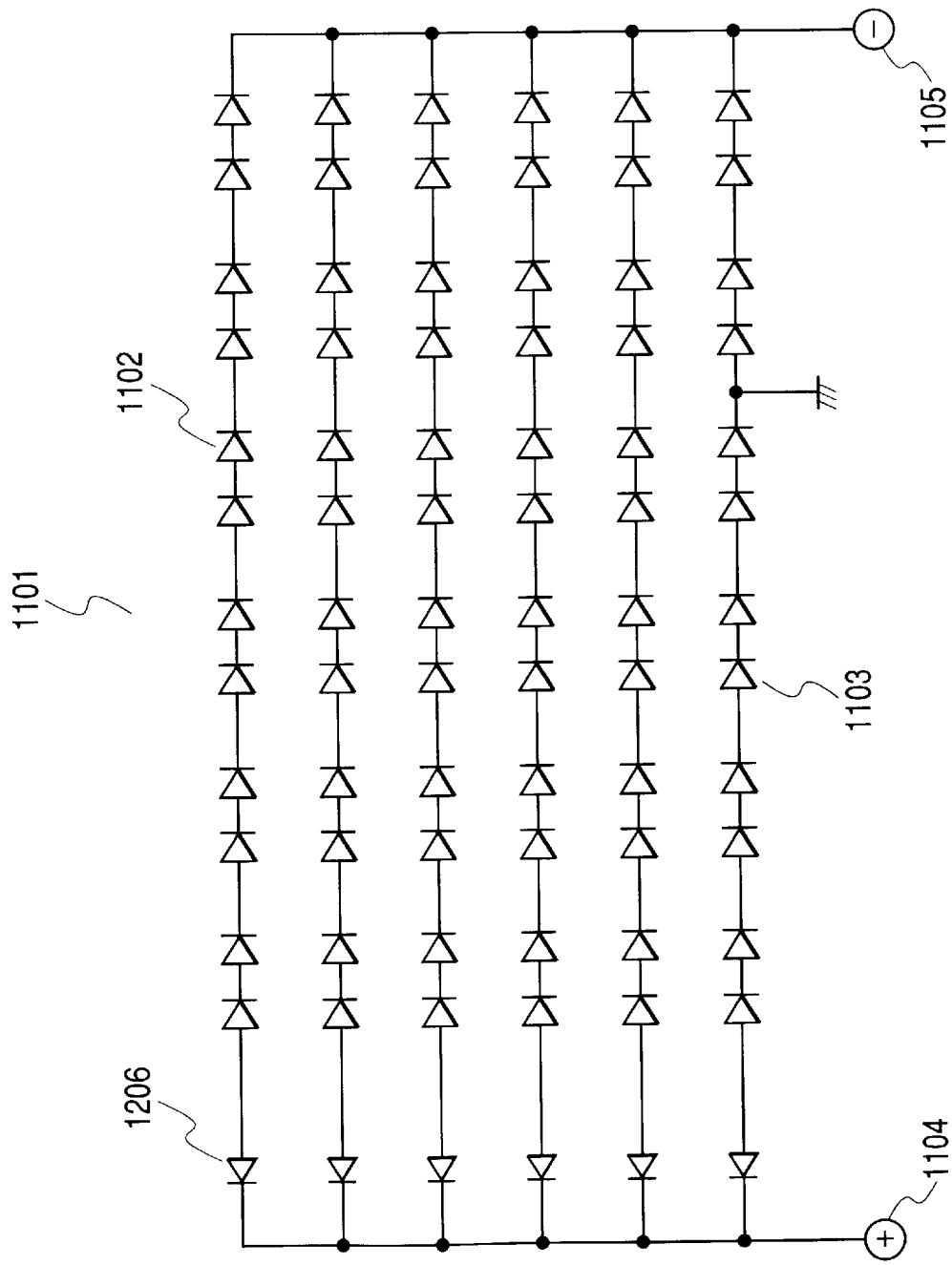
FIG. 12 is an equivalent circuit diagram for showing an embodiment of a solar cell array according to this invention.

The first and second embodiments of a solar cell array of this invention will be described with reference to FIG. 11. A solar cell array 1101 shown in FIG. 11 is composed of six solar cell strings. Only a solar cell string 1103 is the solar cell string according to this invention shown in FIGS. 9 and 10, and the remaining five solar cell strings 1102 are the same as the string 1103 except that the strings themselves are not grounded. The solar cell array 1101 has a positive terminal 1104 and a negative terminal 1105, and reverse-current blocking diodes (not shown in the drawings) are connected in series to the respective strings. Besides, FIG. 12 is an equivalent circuit diagram of this solar cell array. The solar cell array 1101 comprises one solar cell string 1103 having a grounding point therein according to this invention and five strings 1102 having no grounding point. To the respective strings, reverse-current blocking diodes 1206 are connected in series.

Now, the first embodiment of the solar photovoltaic power generation system of this invention will be described with reference to FIG. 13. In a solar photovoltaic power generation system 1301 according to this invention shown in FIG. 13, a power conditioner 1303 is connected to an output of the solar cell array 1302 of this invention, which is identical to that shown in FIG. 11, and an insulation transformer 1304 is provided between the power conditioner and an electric power system 1305. Thus, when a ground-fault current appears in the solar cell array of this invention, the electric power system can be prevented from being affected by the ground-fault current.

The second embodiment of the solar photovoltaic power generation system of this invention will be described with reference to FIG. 14. In a solar photovoltaic power generation system 1401 according to this invention shown in FIG. 14, a charging control apparatus 1403 is connected to the output side of the solar cell array 1402 of this invention, which is identical to that shown in FIG. 11, and an electricity storage apparatus 1404 is connected to the charging control apparatus 1403.

Now, the components of the solar cell string, the solar cell array and the solar photovoltaic power generation system according to this invention will be described in detail.

Solar Cell

Figure 1:
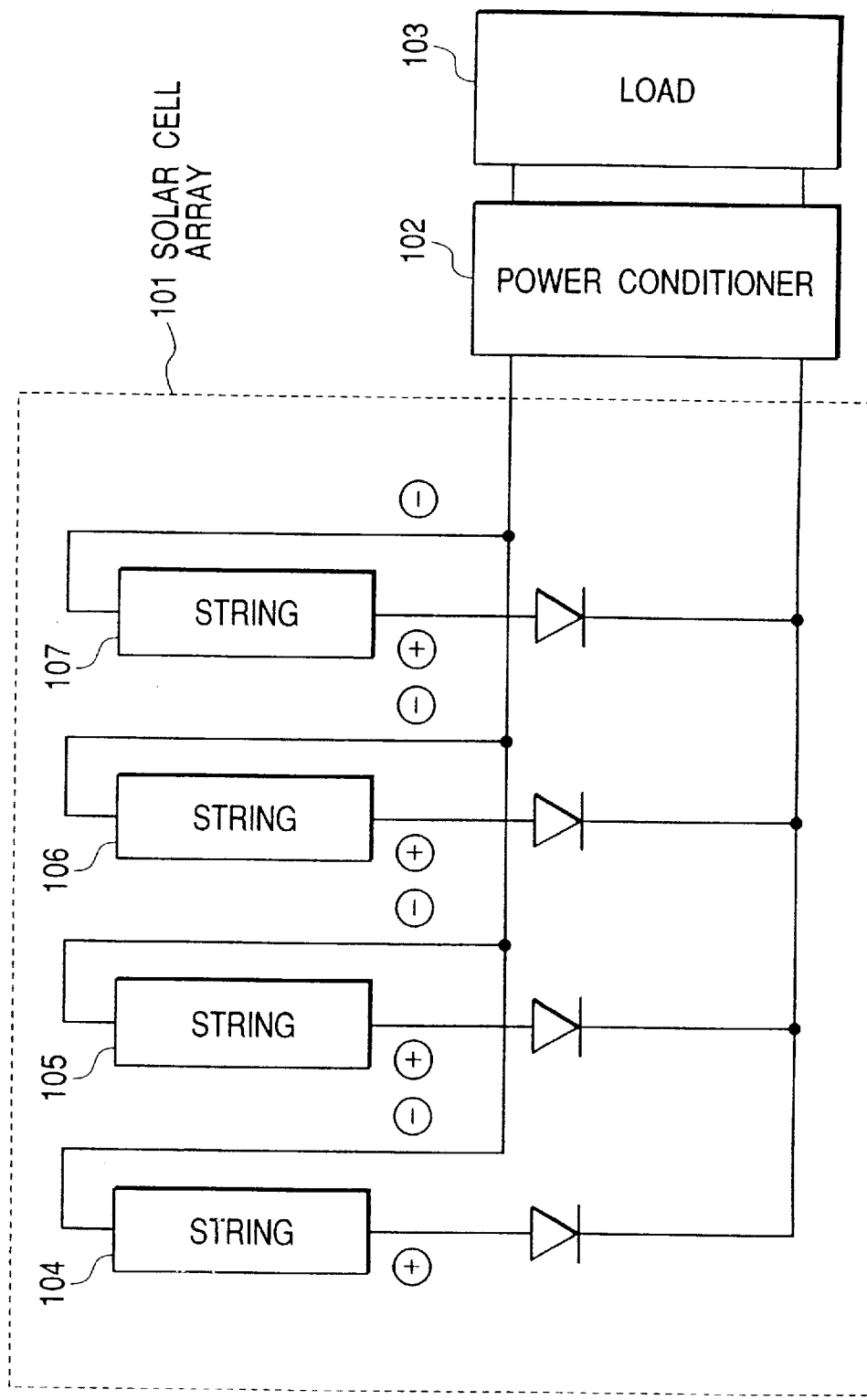
FIG. 1 is a block diagram of a conventional solar photovoltaic power generation system.
Figure 2:
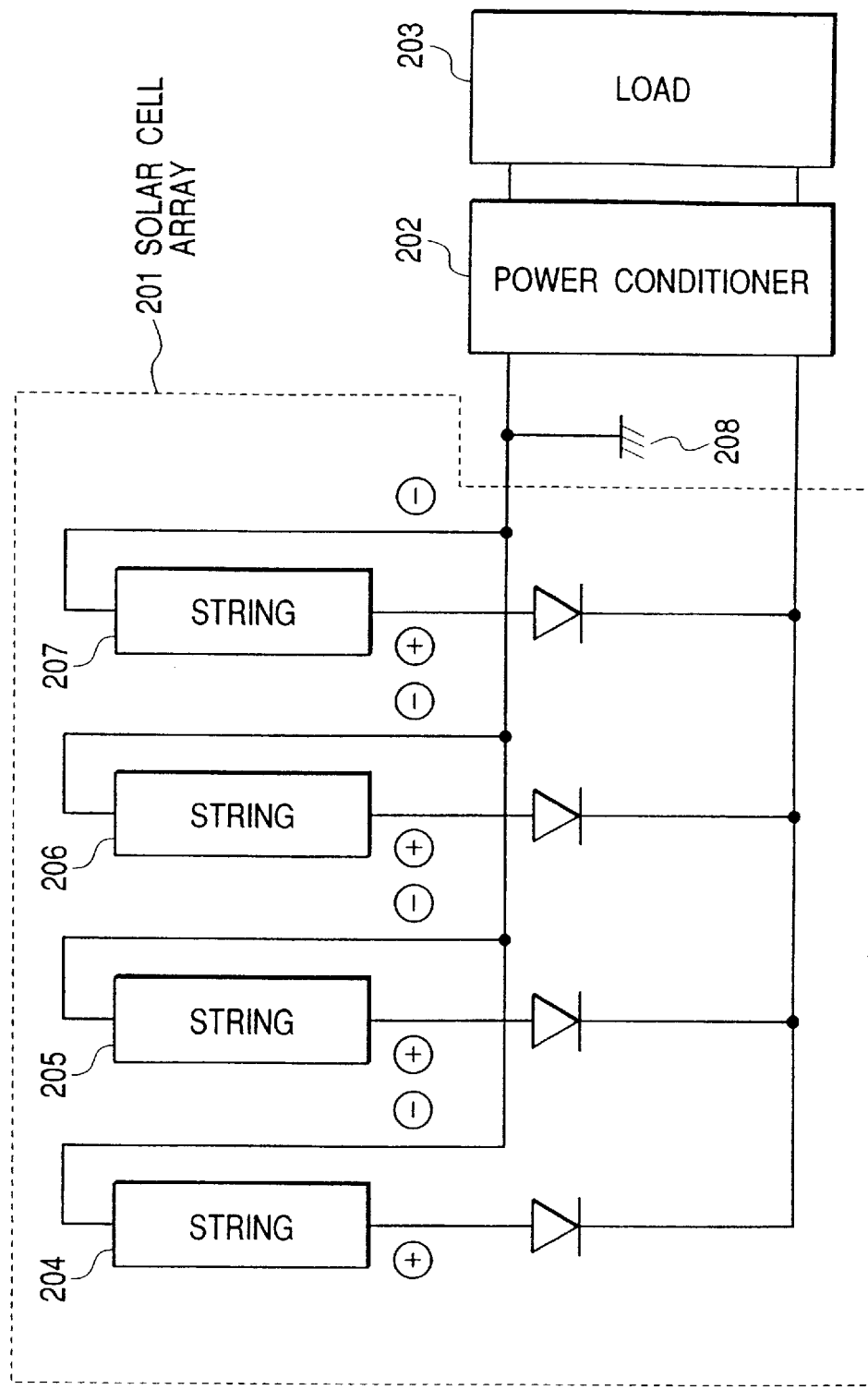
FIG. 2 is a block diagram of a solar photovoltaic power generation system.
Figure 3A:
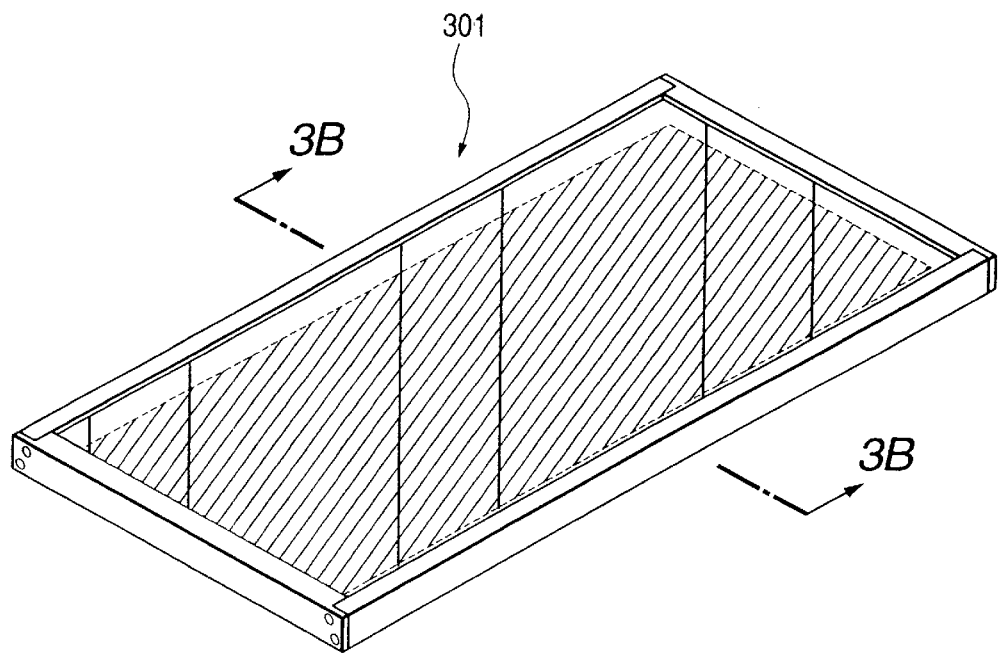
FIGS. 3A and 3B are perspective and sectional views for showing an example of a conventional solar cell module.
Figure 3B:
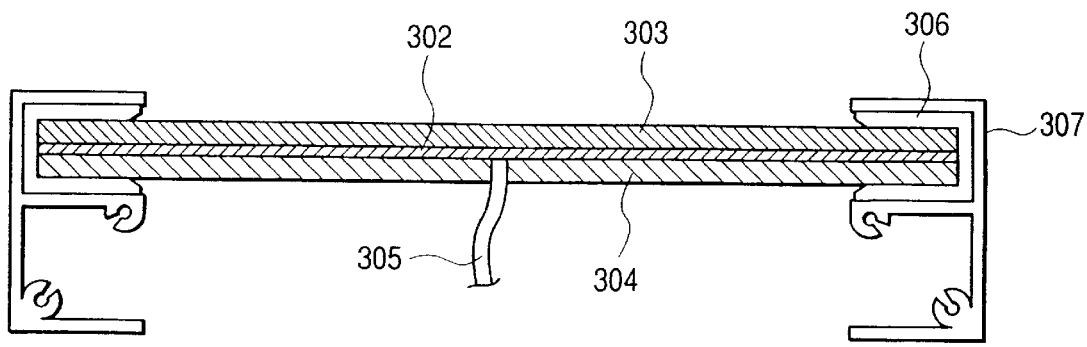
Figure 4:
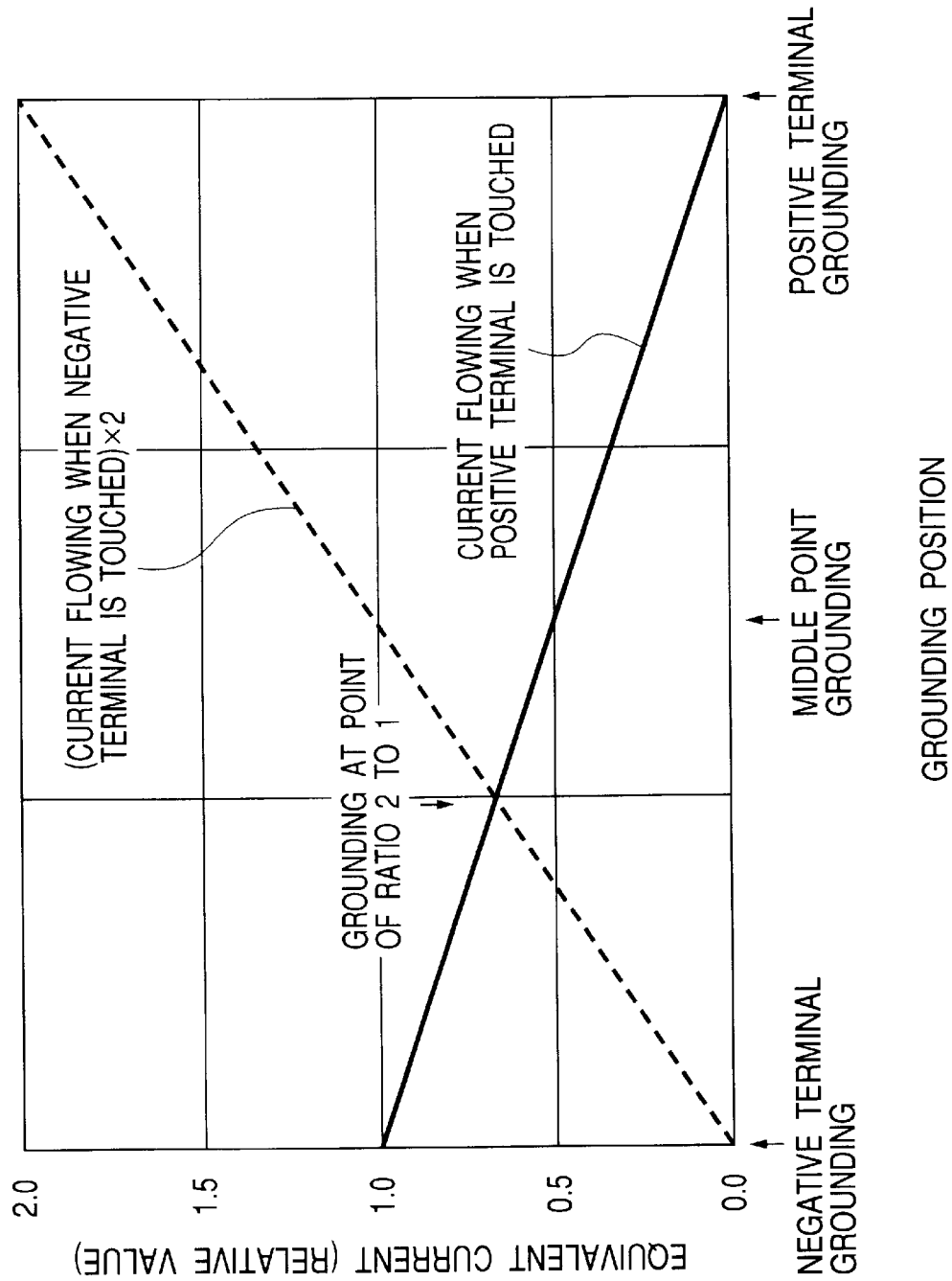
FIG. 4 is a graph for explaining an action of this invention.
Figure 5:
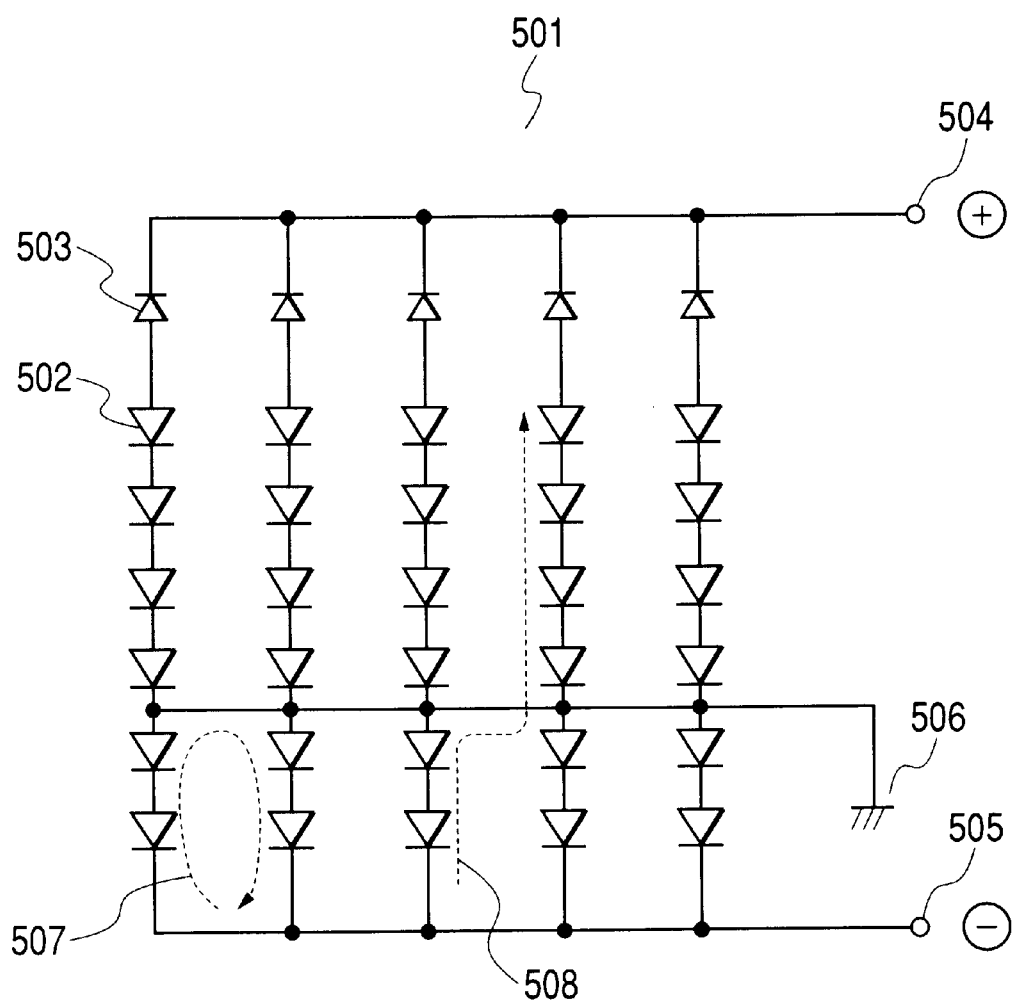
FIG. 5 is an equivalent circuit diagram illustrating an action of this invention.
Figure 6:
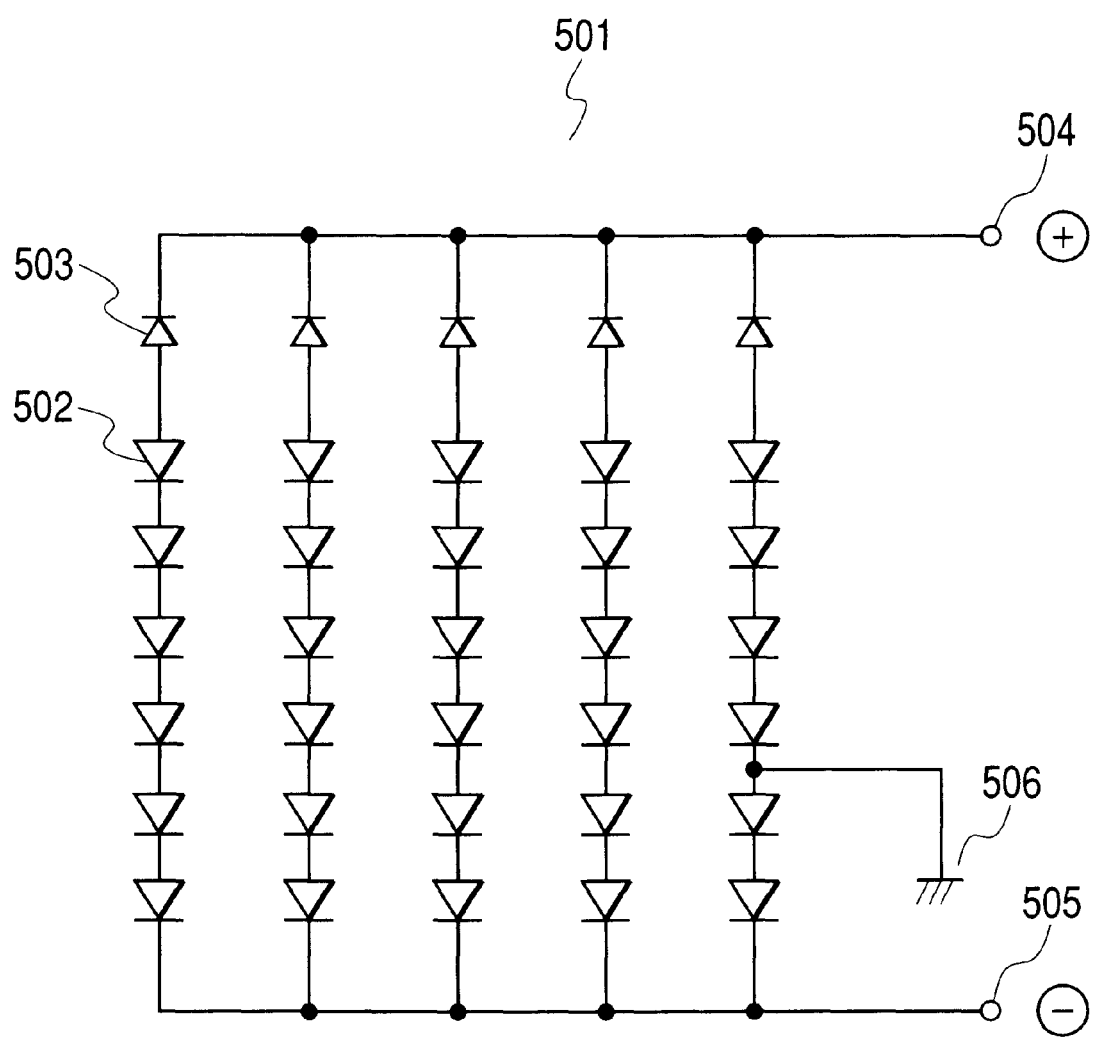
FIG. 6 is an equivalent circuit diagram illustrating an action of this invention.

The solar cell in this invention is not limited to a particular type. The conventional solar cell module having the electrical insulation performance as shown in FIGS. 3A and 3B may be used, or the solar cell having no electrical insulation performance as shown in FIGS. 7A and 7B may be used. However, in the case where the conventional solar cell module having the electrical insulation performance is used, it is essential that an electric line other than that in the solar cell module, that is, a member for interconnecting the solar cell modules in series or parallel and the like, be not housed in an insulating envelope and be in a non-insulated state.

A material for the photoelectric conversion layer of the solar cell may be polycrystalline semiconductor including elements belonging to the Group IV of the periodic table, such as Si, C and Ge, Group IV element alloy such as SiGe and SiC, III-V compounds such as GaAs, InSb, GaP, GaSb, InP and InAs, II-VI compounds such as ZnSe, CdTe, ZnS, CdS, CdSe and CdTe, and I-III-VI2 compounds such as $CuInSe_2$, $CuInS_2$ and $Cu(In, Ga)Se_2$. Further, the material may be an amorphous (a-) semiconductor such as a-Si:H, a-SiGe:H and a-SiC:H. It may be a microcrystalline ($\mu$c-) semiconductor such as $\mu$c-Si:H, $\mu$c-SiGe:H and $\mu$c-SiC:H.

In the case where the conventional solar cell module shown in FIGS. 3A and 3B is used as the solar cell of this invention, the front cover 303 may be preferably an inorganic glass member such as a white glass and a soda lime glass, or a member made of polycarbonate, acrylic resin, polystyrene or polyester resin. The thickness of the front cover, which varies with the characteristics of the material, is preferably equal to or more than 0.5 mm in general. A material of the back cover 304 may be, in addition to the materials of the front cover listed above, a synthetic resin such as nylon, polyethylene terephthalate (PET) and polyvinyl fluoride (PVF), glass or metal plate. For the frame member 307, aluminum may be used. An internal circuit of such a solar cell module is completely insulated from the outside including the frame member, and the electric line in the solar cell module is not exposed to the outside. That is, the electric line is housed in the insulating envelope. Here, a generally used lead wire that is coated with a resin corresponds to the lead wire housed in the insulating envelope.

The non-insulated solar cell having the charging part exposed and the electric line not housed in the insulating envelope as shown in FIGS. 7A and 7B is more preferably used in this invention. While FIGS. 7A and 7B show the example of the amorphous silicon-based photovoltaic element provided on the metal substrate, this invention is not limited thereto, and photovoltaic elements having the above-described various photoelectric conversion layers may be used.

The coating member of the non-insulated solar cell does not cover the entire surface of the solar cell, and a minimum required part is covered therewith to prevent the power generation performance in the outdoor environment from being affected. Specifically, although varying according to the type of the photovoltaic element used, at least an active area of the photovoltaic element needs to be covered. For the coating member on the side of the light-receiving surface, a translucent synthetic resin is bonded to the surface using an adhesive or pressure sensitive adhesive. Specifically, the material thereof may be fluorocarbon resin, acrylic resin, polyester or polycarbonate. More specifically, it may be polyvinylidene fluoride (PVdF), polyvinyl fluoride (PVF) or ethylene tetrafluoroeyhylene copolymer (ETFE). Polyvinylidene fluoride is superior in weatherability, and ethylene tetrafluoroeyhylene copolymer is superior in compatibility between weatherability and mechanical strength and in transparency. In terms of cost, the thickness of the transparent member is preferably 100 $\mu$m or less. Furthermore, in order to reduce the cost, an acrylic resin or fluororesin transparent paint may be used in stead of the film. In this case, a coating method generally used for application is adopted.

Grounding Position

A grounding position in this invention is selected among from an electrical middle point of the electric line of the solar cell string, a point between the electrical middle point and the negative terminal, or the negative terminal. The "electrical middle point" refers to a position where an intermediate potential between potentials of the positive and negative terminals is attained with the solar cell string being in operation or the circuit being opened. If all the solar cells interconnected in the solar cell string have substantially the same characteristics, a physical middle point of the solar cell sequence is the electrical middle point, of course. Electrically, the grounding is provided at one position. However, as far as the grounding is provided at one position in terms of the equivalent circuit, the grounding may be provided at a plurality of positions in order to reduce a contact resistance, for example. Besides, the grounding may be provided at a position on the side of the negative terminal with respect to the electrical middle point and on the side of the electrical middle point with respect to the negative terminal to improve safety.

Specifically, the grounding may be provided at a position where the ratio of the absolute value of the voltage to ground of the positive terminal to that of the negative terminal is substantially 2 to 1 to improve safety further. The position where the ratio between the absolute values of the voltage to ground is 2 to 1 is a position where, with the solar cell string being in operation or the circuit being opened, the potential is represented by: ((potential of negative terminal)+ ((potential of positive terminal)−(potential of negative terminal))/3. If all the solar cells interconnected in the solar cell string have substantially the same characteristics, a position where the solar cell sequence is physically separated at a ratio 2 to 1 becomes the electrical middle point, of course. If the point of the ratio 2 to 1 lies in an internal circuit of a solar cell, a position between the solar cells having a potential closest to that of the point of the ratio 2 to 1 is to be selected.

Serial/Parallel Interconnection Member

In order to form the solar cell string or solar cell array of the solar cells, it is required to interconnect the solar cells in series or parallel and the solar cell strings in parallel. It is a serial/parallel interconnection member that realizes the serial or parallel interconnection. In the rest-integrated solar cell 801 shown in FIGS. 8A and 8B and having two solar cells 701 connected in series, no serial/parallel interconnection member is used, and the front wiring member and the back wiring member of the respective solar cells are directly connected to each other. On the other hand, in the solar cell string 901 shown in FIG. 9, the serial/parallel interconnection member 906 is used to interconnect the rest-integrated solar cells 801 in series. Furthermore, the wiring members leading to the positive and negative terminals in FIG. 9 are also equivalent to the serial/parallel interconnection member. In the solar cell array 1101 shown in FIG. 11, the wiring members leading to the positive and negative terminals of the solar cell array correspond to the serial/parallel interconnection member.

For the serial/parallel interconnection member, a general-purpose insulated wire or insulated cable may be used. However, more preferably, a bare wire without an insulating coating is used. As the bare wire, a copper wire, a copper strand, a copper band and the like are preferably used.

Now, this invention will be described in more detail with reference to examples. However, this invention should not be limited to the examples.

EXAMPLE 1

As the first example of this invention, formation of the solar cell string shown in FIG. 9 will be described. For the solar cell, the amorphous silicon-based photovoltaic element shown in FIGS. 7A and 7B is used. An open circuit voltage and an optimal operating voltage of one solar cell in the standard state are 2 V and 1.5 V, respectively. As shown in FIGS. 7A and 7B, the front wiring member 702, the back wiring member 703 and the metal substrate 706 of the solar cell are not housed in the insulating envelope, and thus, the solar cell is the non-insulated one. First, two solar cells are serialized as shown in FIGS. 8A and 8B. Here, the front wiring member of one solar cell and the back wiring member of the adjacent solar cell are connected by soldering. Then, the two serialized solar cells are bonded to the back support member using the elastic epoxy adhesive 804 as shown in FIGS. 8A and 8B. Here, a part of the metal substrate 706 and the back wiring member 703 of the solar cell is in contact with the concrete back support member 803, so that electrical insulation between the solar cell circuit and the concrete member is not attained. Next, six rest-integrated solar cells 801 shown in FIGS. 8A and 8B are connected in series as shown in FIG. 9. For the serial connection, a bare copper band (1 mm thick and 12 mm width) is used. In addition, the copper band 905 between the second and third rest-integrated solar cells from the negative terminal is grounded. The grounding is the class D grounding, and the grounding resistance is 20 Ω.

The voltages to ground of the completed solar cell string in the open circuit state are +16 V at the positive terminal and −8 V at the negative terminal. This can be considered to provide higher safety in comparison with the case where the positive terminal is grounded, in which the voltage to ground at the negative terminal would be −24 V. In this solar cell string, the inexpensive non-insulated solar cell is used. Therefore, a significant cost reduction can be realized.

EXAMPLE 2

The second example of this invention is the same as Example 1 except that the grounding position of the string is set at the electrical middle point. The voltages to ground of the completed solar cell string in the open circuit state are +12 V at the positive terminal and −12 V at the negative terminal. This can be considered to provide higher safety in comparison with the case where the positive terminal is grounded, in which the voltage to ground at the negative terminal would be −24 V.

EXAMPLE 3

The third example of this invention is the same as Example 1 except that the grounding position of the string is set at the negative terminal. The voltages to ground of the completed solar cell string in the open circuit state are +24 V at the positive terminal and 0 V at the negative terminal. This can be considered to provide higher safety in comparison with the case where the positive terminal is grounded, in which the voltage to ground at the negative terminal would be −24 V, because it is a positive potential although it has the same absolute value.

EXAMPLE 4

As the fourth example of this invention, formation of the solar cell array 1101 shown in FIG. 11 will be described. As shown in FIG. 11, this solar cell array is composed of six solar cell strings. Of the six solar cell strings, only one is the solar cell string having an electric line grounded shown in Example 1, and the remaining strings are not grounded. The voltages to ground of the completed solar cell array in the open circuit state are +16 V at the positive terminal and −8 V at the negative terminal. This can be considered to provide higher safety in comparison with the case where the positive terminal is grounded, in which the voltage to ground at the negative terminal would be −24 V.

EXAMPLE 5

As the fifth example of this invention, formation of the solar photovoltaic power generation system shown in FIG. 13 will be described. In this example, the solar cell array in Example 4 is connected to the power conditioner, which is then connected to the power system via the insulation transformer as shown in FIG. 13. The completed solar photovoltaic power generation system can provide high safety as described above, and can be less expensive in comparison with a conventional solar photovoltaic power generation system because the non-insulated solar cell is used.

The solar cell string, the solar cell array and the solar photovoltaic power generation system according to the preferred implementations of this invention can provide the following advantages.

(1) For the solar cell string, the solar cell array and the solar photovoltaic power generation system according to this invention, at least a part of the electric line of the solar cell string is not housed in the insulating envelope. Such a configuration makes it possible to significantly reduce costs of material and processing. Thus, the solar cell string, the solar cell array and the solar photovoltaic power generation system, which are significantly less expensive compared to the prior art, can be provided.

(2) According to this invention, the electric line of the solar cell string is grounded to at least one electrical middle point thereof or a point on the side of the negative terminal with respect to the electrical middle point, and thus, safety can be improved.

(3) In the solar cell array and the solar photovoltaic power generation system of this invention, only one of the solar cell strings therein is grounded. Thus, an undesirable loop current or a current flowing through over the different strings can be reduced, and therefore, a long-term reliability of the solar cell array and the solar photovoltaic power generation system can be improved.

(4) In the solar photovoltaic power generation system of this invention, when it is the utility connected system, the insulation transformer is provided between the power conditioner and the power system to completely separate the solar cell array circuit from the power system circuit in terms of direct current. Thus, the power system can be prevented from being affected by the ground-fault current of the solar cell array.

What is claimed is:

1. A solar cell string comprising: a plurality of solar cells interconnected in series and/or parallel, one positive terminal, and one negative terminal, wherein at least a part of a charging electric line of the solar cell string is not housed in an insulating envelope, and the charging electric line of the solar cell string is grounded at an electrical middle point between the positive and negative terminals or a point on the side of the negative terminal with respect to the electrical middle point.

2. The solar cell string according to claim 1, wherein the grounding is provided at a point between the negative terminal and the electrical middle point excluding the negative terminal and the electrical middle point.

3. The solar cell string according to claim 1, wherein the grounding is provided at a position where a ratio in absolute value of voltage to ground of the positive terminal to the negative terminal is about 2 to 1.

4. The solar cell string according to claim 1, wherein at least a part of an electrode or wiring member arranged on a light-receiving surface side of a solar cell is not housed in the envelope.

5. The solar cell string according to claim 4, wherein the solar cell has a photoelectric conversion layer, a collector electrode and a front wiring member arranged on a light-receiving surface side of the photoelectric conversion layer, and a coating member arranged on the light-receiving surface side of the photoelectric conversion layer, and a part of the collector electrode or front wiring member is a non-coated part where the coating member is absent.

6. The solar cell string according to claim 5, wherein the coating member is a resin member formed by coating.

7. The solar cell string according to claim 1, wherein at least a part of an electrode or wiring member arranged on a non-light-receiving surface side of a solar cell is not housed in the envelope.

8. The solar cell string according to claim 7, wherein the solar cell has a photoelectric conversion layer, and a back electrode and a back wiring member arranged on a non-light-receiving surface side of the photoelectric conversion layer, a back support member for supporting the solar cell is arranged on the non-light-receiving surface side of the solar cell, at least a part of a surface of the back support member is made of a non-insulating material, and the surface of the non-insulating material is not insulated from the back electrode or back wiring member.

9. The solar cell string according to claim 1, wherein a serial/parallel interconnection member for interconnecting the solar cells in series and/or parallel is a conductor having no insulating coating.

10. A solar cell array comprising a plurality of solar cell strings interconnected in parallel, each of the solar cell strings comprising a plurality of solar cells interconnected in series and/or parallel, wherein the solar cell array further has at least one solar cell string according to claim 1.

11. A solar cell array comprising a plurality of solar cell strings interconnected in parallel, each of the solar cell strings comprising a plurality of solar cells interconnected in series and/or parallel, wherein the solar cell array further has only one solar cell string according to claim 1.

12. A solar photovoltaic power generation system, comprising a solar cell array according to claim 10, a power conditioner for converting a direct current output of the solar cell array into an alternating current output, and an insulation transformer connected to an output side of the power conditioner.

13. A solar photovoltaic power generation system, comprising a solar cell array according to claim 11, a power conditioner for converting a direct current output of the solar cell array into an alternating current output, and an insulation transformer connected to an output side of the power conditioner.

14. A solar photovoltaic power generation system, comprising a solar cell array according to claim 10, an electricity storage apparatus for storing electric energy generated by the solar cell array, and a charging control apparatus connected between the solar cell array and the electricity storage apparatus.

15. A solar photovoltaic power generation system, comprising a solar cell array according to claim 11, an electricity storage apparatus for storing electric energy generated by the solar cell array, and a charging control apparatus connected between the solar cell array and the electricity storage apparatus.

* * * * *

UNITED STATES PATENT AND TRADEMARK OFFICE
CERTIFICATE OF CORRECTION

PATENT NO.   : 6,703,555 B2
DATED        : March 9, 2004
INVENTOR(S)  : Akiharu Takabayashi et al.

It is certified that error appears in the above-identified patent and that said Letters Patent is hereby corrected as shown below:

Column 2,
Line 39, "has" should read -- have --.

Column 5,
Line 39, "has" should read -- have --.
Line 53, "has" should read -- have --.
Line 56, "solar cell is" should read -- solar cell be --.
Line 59, "is made" should read -- be made --.
Line 60, "is not" should read -- not be --.

Column 6,
Lines 5 and 14, "sell" should read -- cell --.
Line 16, "invention can be provided" should read -- invention --.
Line 17, "strings" should read -- strings can be reduced --.
Line 58, "sectional view" should read -- sectional views --.

Column 7,
Line 17, "modification or combination" should read -- modifications and combinations --.

Column 8,
Line 24, "sell" should read -- cell --.

Column 9,
Line 14, "be not" should read -- not be --.
Line 19, "alloy" should read -- alloys --.

UNITED STATES PATENT AND TRADEMARK OFFICE
CERTIFICATE OF CORRECTION

PATENT NO. : 6,703,555 B2
DATED : March 9, 2004
INVENTOR(S) : Akiharu Takabayashi et al.

It is certified that error appears in the above-identified patent and that said Letters Patent is hereby corrected as shown below:

Column 10,
Lines 2 and 4, "tetrafluoroeyhylene" should read -- tetrafluoroethylene --.
Line 9, "in stead" should read -- instead --.
Line 13, "among" should be deleted.
Line 14, "from" should read -- from among --.

Signed and Sealed this

Thirty-first Day of August, 2004

JON W. DUDAS
*Director of the United States Patent and Trademark Office*